United States Patent [19]

Arima et al.

[11] Patent Number: 4,926,793
[45] Date of Patent: May 22, 1990

[54] METHOD OF FORMING THIN FILM AND APPARATUS THEREFOR

[75] Inventors: Noburu Arima, Kubiki; Nobuyosi Ogino, Tokyo; Hirosi Kimura, Takefu, all of Japan

[73] Assignees: Shin-Etsu Handotai Co., Ltd.; Sin-Etsu Quartz Products Co., Ltd., both of Tokyo, Japan

[21] Appl. No.: 126,784

[22] Filed: Nov. 30, 1987

[30] Foreign Application Priority Data

Dec. 15, 1986 [JP] Japan .................... 61-296636
Dec. 15, 1986 [JP] Japan .................... 61-296637

[51] Int. Cl.$^5$ .................................................. C23C 16/00
[52] U.S. Cl. .................................. 118/730; 118/715; 118/725; 118/728
[58] Field of Search ............... 118/723, 725, 715, 728, 118/730

[56] References Cited

U.S. PATENT DOCUMENTS

| | | | |
|---|---|---|---|
| 3,424,628 | 1/1969 | Winings | 118/725 |
| 3,460,510 | 8/1969 | Currin | 118/725 |
| 3,652,444 | 2/1972 | Lester | 204/298 |
| 3,845,738 | 11/1974 | Berkman | 118/725 |
| 3,865,072 | 2/1975 | Kirkman | 118/730 |
| 4,282,267 | 8/1981 | Kuyel | 427/45.1 |
| 4,421,786 | 12/1983 | Mahajan | 118/725 |
| 4,446,817 | 5/1984 | Crawley | 118/725 |
| 4,499,853 | 2/1985 | Miller | 118/725 |
| 4,509,456 | 4/1985 | Kleinert | 118/725 |
| 4,582,720 | 4/1986 | Yamazaki | 118/723 |

FOREIGN PATENT DOCUMENTS

| | | | |
|---|---|---|---|
| 0143127 | 7/1980 | German Democratic Rep. | 118/725 |
| 59-90632 | 5/1984 | Japan | 118/723 |
| 60-10618 | 1/1985 | Japan | 118/723 |
| 60-63920 | 4/1985 | Japan | 118/723 |
| 60-149781 | 8/1985 | Japan | 118/725 |
| 61-136221 | 6/1986 | Japan | 118/723 |

*Primary Examiner*—Richard Bueker
*Attorney, Agent, or Firm*—Foley & Lardner, Schwartz, Jeffery, Mack, Schwaab, Blumenthal & Evans

[57] ABSTRACT

The present invention relates to a method of forming oxide or other insulating films on semiconductor wafers and other substrates and single-crystal films (epitaxial films) having the same crystal orientation as that of the substrates according to chemical reactions between reaction gases or chemical reactions between the reaction gas and the substrates, and an apparatus therefor such as an epitaxial growth apparatus, an oxidation apparatus, or the like, and more particularly, a method of forming a uniform thin film on each of a large number of substrates and an apparatus therefor.

According to an aspect, vertical sets of substrates are stacked in a peripheral space radially spaced apart from a central portion of the active space by a predetermined distance. A reaction gas has passed through a reaction region on a surface of one substrate can be exhausted outside the reactor without affecting a reaction region on a surface of another substrate. The number of substrates to be treated can be greatly increased, and at the same time uniformities of thickness, resistivity, and other qualities between substrates and within each substrate can be greatly improved.

When a hot wall type apparatus is employed, attachment of reaction byproducts dropping from the inner wall surface of the reactor to the surfaces of the substrates can be prevented. Even if a plurality of substrates are arranged immediately below the reaction gas outlet port, the reaction gas can be flowed under a laminar flow condition, has a uniform temperature profile and can be flowed in the reaction region on the surface of each substrate. The above mentioned effects of the present invention is further enhanced.

9 Claims, 4 Drawing Sheets

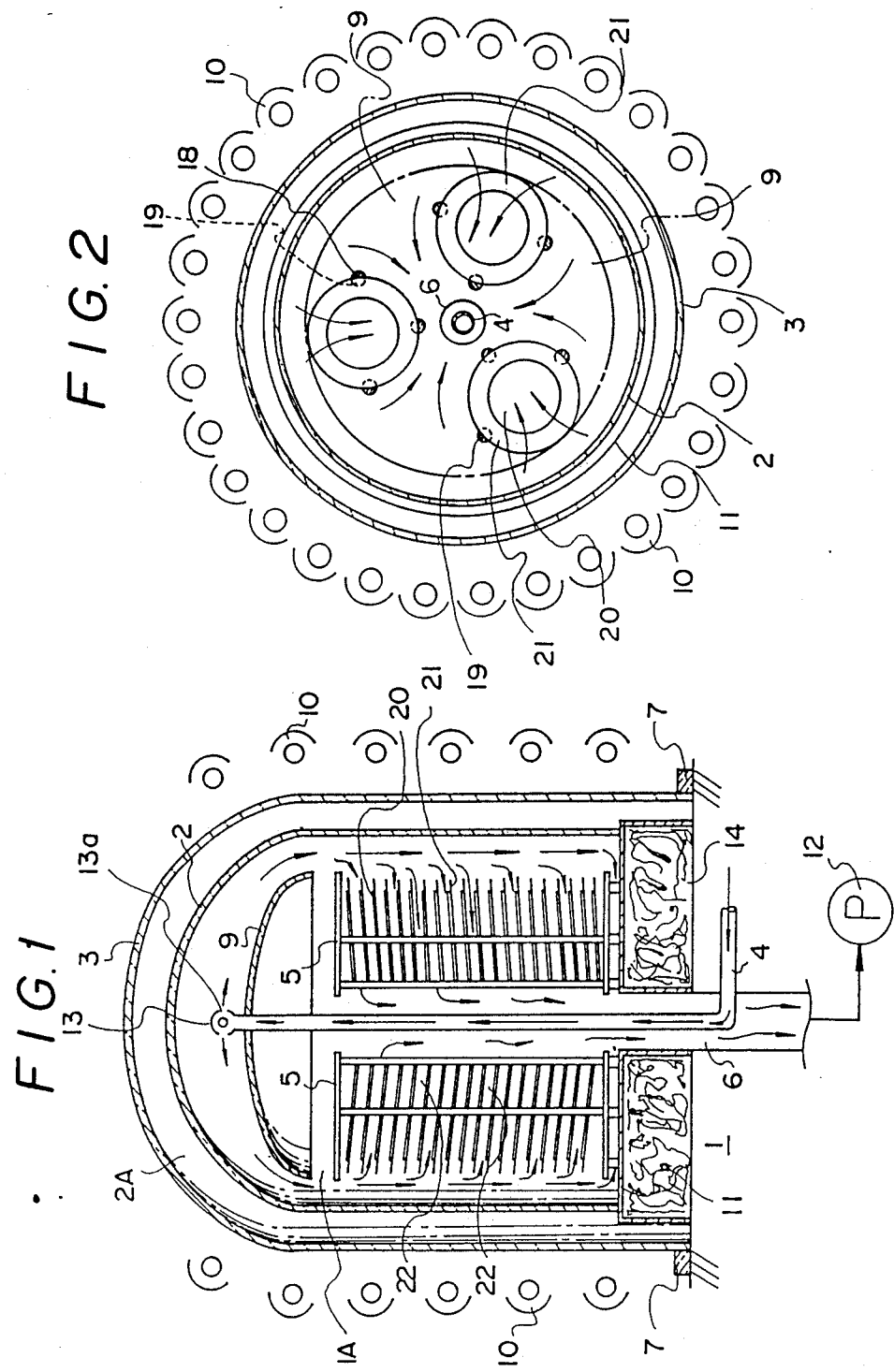

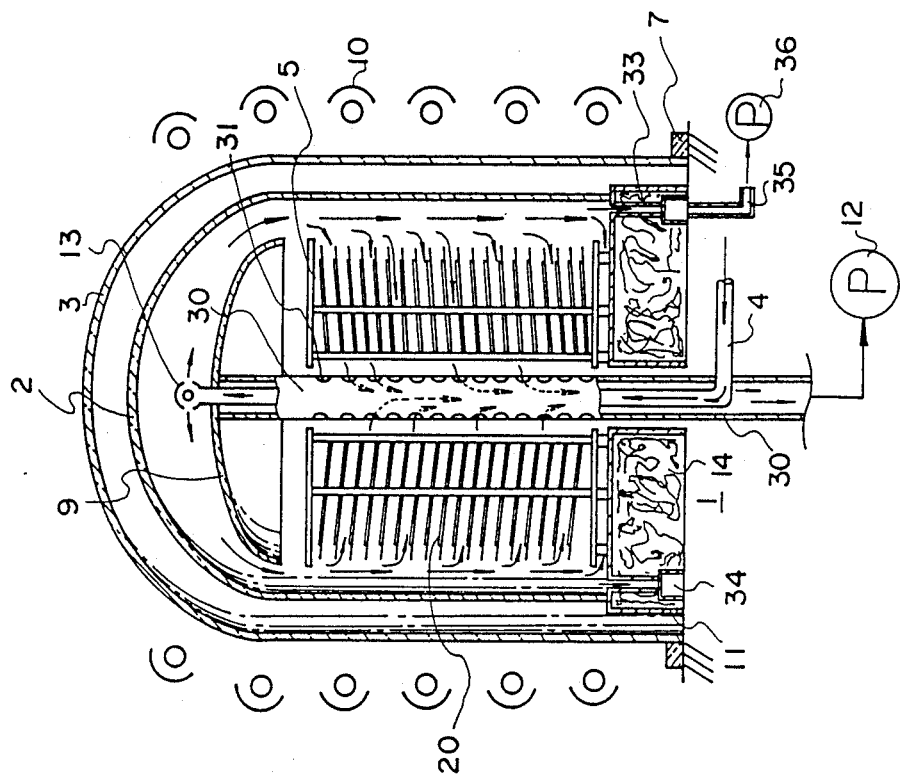
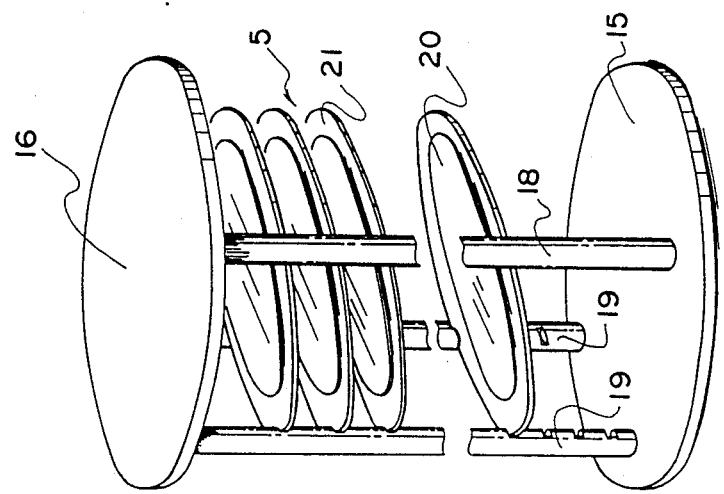

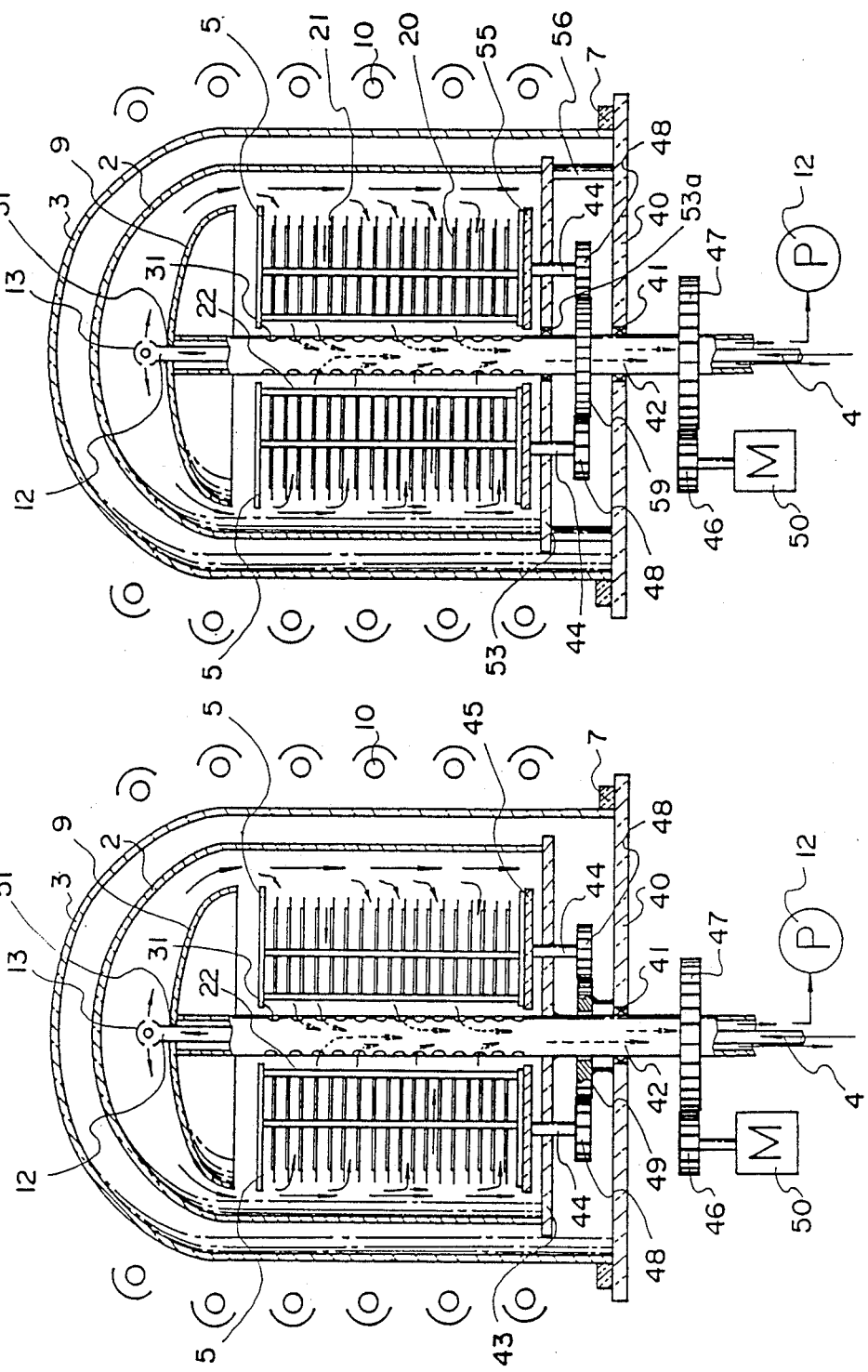

METHOD OF FORMING THIN FILM AND APPARATUS THEREFOR

BACKGROUND OF THE INVENTION

1. Field of the Invention

The present invention relates to a method of forming oxide or insulating films on semiconductor wafers and other substrates of different materials or single-crystal films (epitaxial films) having the same crystal orientation as that of the substrates thereon according to chemical reactions between reaction gases or chemical reactions of a reaction gas with the substrates, and an apparatus therefor such as an epitaxial growth apparatus, an oxidation apparatus, or the like, and more particularly, a method of forming a uniform thin film on each of a large number of substrates and an apparatus therefor.

2. Description of the Prior Art

In a conventional epitaxial growth apparatus (to be referred to as a first prior art apparatus hereinafter), a disk-like susceptor plate rotates around its vertical axis in a bell jar type reactor surrounded by an RF induction heater, and each substrate placed on the corresponding susceptor plate is heated to and kept at a high temperature (1,100 to 1,200° C.) by the heater while a reaction gas is supplied to the surface of the substrate, thereby depositing a predetermined epitaxial growth film. In another conventional radiant heating-barrel type epitaxial growth apparatus (to be referred to as a second prior art apparatus hereinafter), a truncated pyramid susceptor is rotatably arranged in a cylindrical reactor, along its vertical axis, surrounded by an RF induction heating element and its RF induction coil, a plurality of semiconductor wafers or other substrates are placed on susceptor surfaces opposite to the heater, and a reaction gas is supplied to the reactor to cause predetermined epitaxial growth on the surfaces.

According to the first prior art apparatus, however, since the substrates are placed on a single plane perpendicular to the axis of the reactor, the number of substrates subject to epitaxial growth is inevitably limiting small. In addition, when the diameter of the wafer is increased, the utilization area of the susceptor is ineffectively decreased.

According to the second prior art apparatus, since the substrates can be placed on only the susceptor surfaces opposite to the heater, the number of substrates subject to epitaxial growth is still inevitably small. In addition, when the diameter of the wafer is incresed, the number of wafers to be epitaxially grown at a time is undesirably decreased. Furthermore, the substrate is positioned on the susceptor surface slightly inclined from a vertical line and it makes automatic loading/unloading difficult.

In either prior art apparatus, since the substrate is placed on the susceptor serving a heating element, at least part of a handling device must be brought into contact with the surface of the substrate when it is loaded/unloaded. Therefore, the substrate may be contaminated by this contact, and the yield tends to be reduced.

As shown in FIG. 7, in an apparatus (Japanese Unexamined Patent Publication (Kokai) No. 60-152675) (to be referred to as a third prior art apparatus), a substrate supporter 103 is arranged in a cylindrical reactor 102 surrounded by resistance heaters or other heat sources 101 in such a manner that the axis of the substrate supporter 103 coincides with that of the reactor 102. Substrates 104 are vertically stacked parallel to each other and substantially perpendicular to the axis of the reactor 102 in the supporter 103. A reaction gas is supplied from nozzles 105 mounted at the upper end portion of the reactor 102 and displaced to a gas exhaust port 106 at the lower end of the reactor 102, thereby performing predetermined epitaxial growth.

According to the third prior art apparatus, since the substrates 104 in the supporter 103 are vertically stacked to be parallel to each other and to be oriented in a direction substantially perpendicular to the axis of the cylindrical reactor 102, the number of substrates subject to epitaxial growth can be increased far beyond those of the first and second prior art apparatuses, so that a vertical thin-film formation apparatus suitable for a wafer having a large diameter can be provided. However, since the substrates are stacked in the axial direction of the reactor, an increase in the number of substrates results in a need for an increase in vertical dimension of heat sources arranged to surround the outer surface of the reactor. Temperature control in the reactor is thus difficult. As a result, a reaction gas temperature profile at the upper portion of the reactor becomes different from that at the lower portion thereof. Then, uniform thin films with the same quality cannot be formed on the upper and lower substrates.

Since the gas is supplied from the upper end of the reactor in a direction (i.e., axial direction) perpendicular to the surface of the substrate and is discharged from an exhaust port at the lower end of the reactor; an exhaust gas flow, a reactant in which is consumed by epitaxial growth on upper substrates continuously flows downward. In other words, when the gas flows downward, the concentration of the reactant is reduced, thereby causing nonuniform thicknesses of the films formed on the upper and lower substrates.

The decrease in concentration of the reactant is inversely proportional to an increase in concentration of a byproduct produced by epitaxial growth. In addition, since the gas temperature is increased, a difference in impurity concentration in the gas flow direction is enhanced. In other words, variations in resistivity tend to occur.

Still another conventional apparatus is proposed to increase the number of wafers simultaneously subject to epitaxial growth and simplify temperature control in the reactor. Unlike in the first and second prior art apparatuses, the susceptor is not heated in order to heat the substrate. A reactor wall is used as a hot wall to maintain the interior of the reactor at a high temperature, and a large number of substrates are horizontally or vertically stacked in the reactor, thereby performing epitaxial growth. This apparatus is called a hot wall type apparatus.

FIG. 8 shows an arrangement of a hot wall type apparatus. A gas conduit 114 axially extends in a reactor 113 along an exhaust port 112 formed at the lower end of a reaction chamber 111 and reaches the upper portion of the reaction chamber 111. A pair of right and left substrate boats 115 are arranged parallel to each other at the sides of the conduit 114 each to support horizontal arrays of a large number of vertically oriented substrates 116 along the widthwise direction of the reactor 113. Heating elements 119 are arranged to surround a reaction chamber 117 at its side and top and below a base 118 as the bottom surface of the reactor. The reactor 113 is maintained at a high temperature through the heating elements 119. A reaction gas is supplied to the reaction chamber 111 through the gas conduit 114 and passes through a large number of vertically oriented substrates 116 on the boats 115, thereby performing epitaxial growth on the surfaces of the substrates 116. The used gas is exhausted from the exhaust port located at the lower end of the inner chamber 113 (Japanese Unexamined Patent Publication (Kokai) No. 60-70177) (to be referred to as a fourth prior art apparatus hereinafter).

In a hot wall type apparatus of this type, however, the reactor itself which defines the reaction chamber is heated at a high temperature. In addition, the reactor is made of a material which includes the same material as the substrate, such as silicon or quartz. The reaction gas supplied to the reaction chamber chemically reacts with the inner wall surface of the reactor, and a chemical product is attached to the inner wall surface of the reactor. The product attached to the wall surface tends to peel from the wall surface due to a difference between the thermal expansion coefficients of the product and the wall material. Flakes peeling off from the inner wall surface tend to be planted to the surfaces of the substrates, resulting in defects.

According to the fourth prior art apparatus, a gas inlet port is located above the substrate, and the gas supplied from the inlet port is struck against the inner wall surface of the reactor above the substrates and then is dispensed around. The reaction byproducts tend to be attached to the upper portions of the side wall surfaces of the reactor, and the defects described above are further accelarated.

According to the system of the fourth prior art apparatus in which the gas is distributed in the reaction chamber from the single gas inlet port, a gas turbulence tends to be formed. In addition, since the substrates are located immediately below the gas inlet port, the gas turbulence affects directly the surface of the substrate. As a result, a uniform film thickness profile cannot be obtained.

In the fourth prior art apparatus, the sealed housing is located to surround the reactor and the reaction chamber is maintained at a predetermined temperature. Since the reaction gas is supplied to the reactor from the gas conduit at room temperature, a temperature difference between the reaction gas and the interior of the reactor is large although the reaction gas is preheated. A nonuniform temperature profile occurs in the reaction region on the surface of the substrate when the substrates are located immediately below the gas inlet port in the construction of the fourth prior art apparatus. As a result, a uniform film thickness, a uniform film quality, and a uniform resistivity distribution cannot be obtained.

In the apparatus for performing epitaxial growth while the reaction gas is supplied from the upper portion of the reaction chamber in which the substrates are vertically oriented, it is difficult to obtain a uniform film thickness distribution and a uniform resistivity distribution. This apparatus can be used for forming an insulating film by thermal oxidation of silicon. However, it cannot be used as an apparatus for forming an epitaxial film with high precision in thickness from the technical viewpoints.

SUMMARY OF THE INVENTION

The present invention has been made in consideration of the conventional drawbacks described above, and has as its object to provide a method of forming a thin film on a wafer having a larger diameter and an apparatus therefor.

It is another object of the present invention to obtain uniform film thickness and other quality distributions not only within a substrate but also between substrates, where the quality means each of thickness and resistivity and the like.

It is still another object of the present invention to simplify handling of the substrate at the time of its loading/unloading to the reaction chamber and to prevent contamination of the substrate at the time of loading/unloading, thereby improving the product yield.

It is still another object of the present invention to prevent reaction byproducts on the inner wall surface of a reactor from attaching to the surface of the substrate even if a hot wall type apparatus is employed.

It is still another object of the present invention to form a gas layer of laminar flow having a uniform temperature profile and supply it to a reaction region of the surface of the substrate, thereby increasing the number of substrates subject to film formation and hence unifying the thicknesses of the films formed on the substrates and eliminating the resistivity variations of the films even if a plurality of substrates are arranged immediately near the reaction gas inlet port.

In order to achieve the above objects according to a first aspect of the present invention, there is provided a method of forming thin films on semiconductor wafers or other substrates of different materials by using chemical reactions in a space above or chemical reactions between a reaction gas and the substrates according to a CVD (Chemical Vapor Deposition) method or an oxidation method, characterized in that (1) a plurality of sets of substrates are vertically stacked in a peripheral region radially spaced at a predetermined distance apart from a central portion of the reaction chamber, and (2) a reaction gas is supplied from a peripheral portion of the reaction chamber to the central portion and vice versa, and preferably the reaction gas passing through a reaction region of a surface of at least one substrate is exhausted outside the active space without affecting a surface of another substrate.

In this case, the active space includes a domed closed space and a tubular open space in the reaction chamber. An activating means includes a heating means, a plasma, light, radiation, etc.

The substrates may be vertically aligned or using cassette-like substrate supporters. Alternatively, branch-like radial support members extending from the center of the reactor may be used to vertically align the substrates.

The reaction gas includes a source gas and a doping gas as well as a gas mixture containing these gases and a carrier gas.

According to the first aspect, the vertical sets of substrates need not stacked in and along the axial direction of the reactor but are arranged in the peripheral space radially spaced apart from the central portion of the active space by a predetermined distance. Therefore, unlike the third prior art apparatus, even if a large number of substrates are vertically stacked, the length of the reactor (tube) for forming the active space can be reduced to about ½ to ¼, thereby simplifying temperature control of the active space. The reaction gas temperature profiles between the substrates can be unified. Therefore, it is easy to form uniform films without causing variations between the substrates.

According to the first aspect of the present invention, the substrates are vertically stacked to be parallel to each other in a space between the central portion of the reaction chamber and a peripheral portion thereof. When the reaction gas is supplied from the peripheral portion to the central portion and vice versa, the reaction gas passing through the reaction region of the surface of at least one substrate can be exhausted within immediately outside the reaction chamber without affecting the surface of another substrate.

In other words, only the gas having the initial concentration of the source gas can pass through the reaction region of the surface of each substrate, and therefore epitaxial growth can be performed at the predetermined concentration of the source gas. Variations of the film thicknesses between the substrates tend not to occur. In addition, the reaction byproducts can be deplaced outside without contacting other substrates, and therefore temperature control can be simplified and variations in resistivity caused by the difference in the impurity concentration in the main gas flow direction can be eliminated. The uniform resistivity and film thickness distributions can be obtained without causing any defect. As a result, the method of the first aspect is compatible with a large diameter of a wafer, and epitaxial film formation requiring high precision can be easily achieved. If this effect is applied to formation of a single-crystal or amorphous thin film by a chemical reaction between the substrate component and the epitaxial reaction gas in addition to formation of the above-mentioned films, and if reaction byproducts are produced in either case of whether reaction rates on the substrate surfaces are constant or not, the same effect as described above can be obtained.

Since the vertical sets of substrates parallel and spaced apart from each other by a predetermined distance are aligned in a direction parallel to the axis of the reactor in a space midway around the central portion of the active area, the substrates can be easily loaded/unloaded to and from the susceptor and automatic handling can be facilitated. Since the alignment directions of the substrates are identical, the reaction gas can pass through the reaction regions of the surfaces of the substrates in a laminar flow. Film uniformities such as in a film thickness distribution of each substrate can be further improved.

According to a second aspect of the present invention, there is provided a thin film forming apparatus for embodying the above method, i.e., a vertical thin film formation apparatus used in thermal-CVD, plasma-CVD, photo-CVD, or MOCVD apparatus, an oxidation apparatus for forming an oxide film on a substrate, and the like at high, atmospheric, or low pressure, characterized in that (1) a plutality of vertical sets of substrates are arranged in a space surrounding the axis of a reactor, the reactor including a domed reactor and a tubular reactor, (2) a reaction gas exhaust means is arranged at least at a central or peripheral portion of the reactor, and (3) the reaction gas distributed from an outlet in the reactor is radially flowed passing through the reaction region of the surface of the substrate, i.e., the reaction gas flow direction is directed from the central portion of the reactor to the peripheral portion thereof and vice versa.

In a preferred embodiment of the present invention, a reaction gas distributing means and a reaction gas discharging means are arranged at proper positions of the central or peripheral portion of the reactor. When the reaction gas passes through the reaction region of the surface of one substrate, this gas does not pass through the reaction region of the surface of another substrate and is discharged outside the reactor.

According to the second aspect of the present invention, in addition to the effect of the first aspect, by using cassette type substrate supporters, the substrates can be loaded or unloaded by the unit of the supporters, thereby improving substrate loading/unloading efficiency. In addition, since the substrate is placed on the support member by a support plate (to be described in a preferred embodiment), a handling device need not be brought into contact with the surface of the substrate at the time of substrate loading/unloading. As a result, contamination of the substrates does not occur, and a product yield is not decreased.

In another preferred embodiment of the present invention, the substrates supported by the support members are slightly inclined in the outward direction. Stoppers are planted in the support members, respectively, thereby holding the substrates at predetermined positions during reactions. If each substrate is kept stationary or rotated about the axis of the reactor (i.e., excluding substrate rotation about its axis), the substrate is inclined at a maximum of about 20°, and the reaction gas can smoothly flow.

According to a third aspect of the present invention, there is provided an arrangement including components of the second aspect as major components and aiming at obtaining higher uniformities of film thickness and resistivity distributions, characterized in that (1) a plutality of vertical sets of substrates are arranged in a peripheral space radially spaced apart from the central portion of the reactor by a predetermined distance, and (2) the sets are rotated about the axis of the reactor and at the same time each substrate is rotated about its axis.

According to a fourth aspect of the present invention, there is provided an arrangement including components of the second aspect as major components and aiming at obtaining higher uniformities of film thickness and resistivity distributions in the same manner as in the third aspect, characterized in that (1) a plurality of vertical sets of substrates are arranged in a peripheral space radially spaced apart from the central portion of the reactor by a predetermined distance, and (2) each substrate is rotated about its axis.

According to the third and fourth aspects of the present invention, the following effects in addition to the effect of the first aspect can be obtained. Since the substrates are rotated about the axis of the reactor or about their axes along the reaction gas flow, the gas flowing on each substrate can be randomized. Uniformities of temperature profile of the substrates and film thicknesses of the CVD-grown films as well as impurity concentration distributions, i.e., the resistivity distribution can be achieved.

In this case, means for rotating the substrates about the axis of the reactor and their axes must be arranged near the reaction space isolated from the reaction gas, thereby preventing film defects caused by particle attachment.

According to a preferred embodiment of the third aspect of the present invention, the gas supply pipe inserted in the reactor along the axis thereof and the support member are rotated relative to each other about the axis of the reactor while the substrates are rotated about their axes. The gas flow direction is circumferentially changed in addition to rotation of the substrate about the axis of the reactor or the axis of the substrate. Therefore, the above-mentioned effects can be further enhanced.

According to a fifth aspect of the present invention, there is provided a thin film forming apparatus suitable for a hot wall type apparatus, characterized in that (1) a guide plate is arranged in a direction substantially perpendicular to at least the axis of the reactor at a position immediately below the reaction gas outlet port (located at the upper portion in the reactor) and above the space in which the substrates are arranged, and (2) the reaction gas supplied from the outlet port of the reactor is distributed along the guide plate in the peripheral portion and the gas flows can pass through the surfaces of the plurality of substrates.

In its preferred embodiment, the reaction gas distributed to the peripheral portion of the reactor by the guide plate passes through the reaction region of the surface of one substrate by a suction means located at the lower end portion of the reactor and can be exhausted outside the reactor.

The reaction gas includes a source gas and a doping gas as well as a gas mixture containing these gases and a carrier gas.

According to a fifth aspect of the present invention, a reaction gas outlet port is separated from a substrate region defined therebelow by a guide plate. Even if reaction byproducts attached to the upper portion of the inner wall surface of the reactor drop due to the difference in thermal expansion coefficient between the byproduct and the wall material, these byproducts are moved over the guide plate not to attach to the substrates below the guide plate. Therefore, defects in the thin film can be decreased to almost none.

According to the fifth aspect of the present invention, even if the gas supplied from the gas outlet port in the reactor forms a turbulence, the gas turbulence can be converted into a laminar flow when it passes between the guide plate and the upper wall surface of the reactor. The gas can pass through the reaction region on the surface of the substrate. Even if a difference in temperature of the gas is present between at the outlet and in the inner region of the reaction chamber, the gas is heated to an equilibrium temperature until it flows through between the guide plate and the upper wall surface of the reactor.

The reaction gas laminar flow having a uniform temperature profile passes through the reaction region, and therefore uniformities in film thickness and resistivity distribution can be obtained. As a result, the present invention can be utilized to design an epitaxial film forming apparatus requiring high-precision control.

The guide plate is made of graphite or any other heat-absorbing material. In this case, the gas can be effectively heated when it flows over the guided plate to the peripheral portion of the reactor.

According to a preferred embodiment of this aspect, the reaction gas can be distributed over the guide plate to the peripheral portion and passes through the reaction region on the surface of the substrate by the suction means located at the lower end of the reactor. The used gas is displaced outside the reactor, so that the gas passing through the reaction region does not change in its concentration of the source gas. Therefore, uniformities of film thickness and resistivity distributions can be further improved.

When the present invention is applied to an oxidation apparatus, the number of substrates subject to this treatment can be greatly increased compared with conventional apparatuses. In addition, even if a large number of substrates are oxidized, the resultant films are free from slip lines and other defects.

BRIEF DESCRIPTION OF THE DRAWINGS:

FIGS. 1 and 2 show a hot wall type Low Pressure CVD apparatus according to an embodiment of first, second and fifth aspects of the present invention, in which FIG. 1 is a longitudinal sectional view thereof and FIG. 2 is a cross-sectional view thereof taken along the line A—A' of FIG. 1;

FIG. 4 is a longitudinal sectional view showing a modification of the embodiment of FIGS. 1 and 2;

FIG. 5 is a longitudinal sectional view of an LPCVD apparatus according to an embodiment of third and fifth aspects of the present invention;

FIG. 6 is a longitudinal sectional view of an LPCVD according to an embodiment of fourth and fifth aspects of the present invention;

FIG. 3 is a perspective view showing a substrate supporter used in these embodiments;

DETAILED DESCRIPTION OF THE PREFERRED EMBODIMENTS

Figure 8:
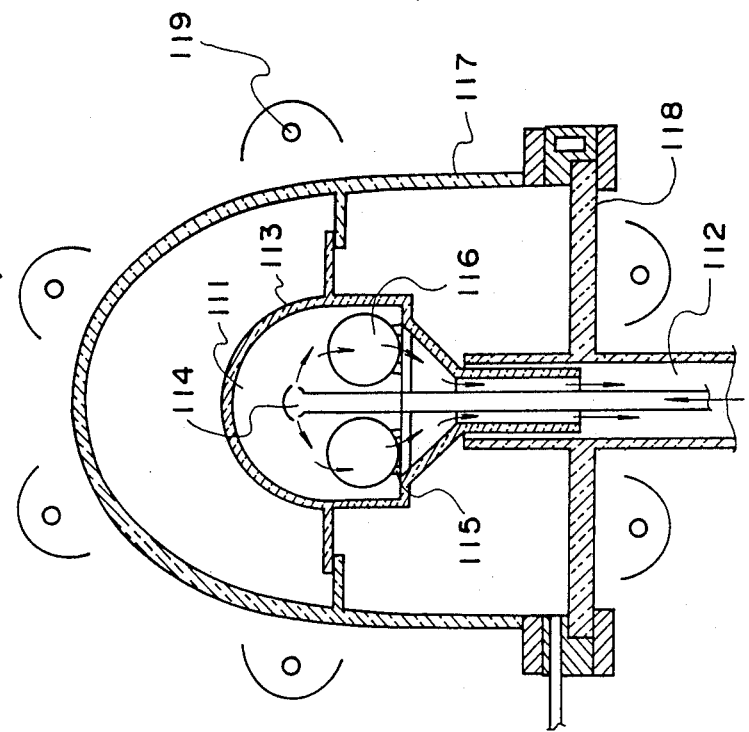
FIG. 8 is a longitudinal sectional view of a hot wall type LPCVD of a fourth prior art.
Figure 7:
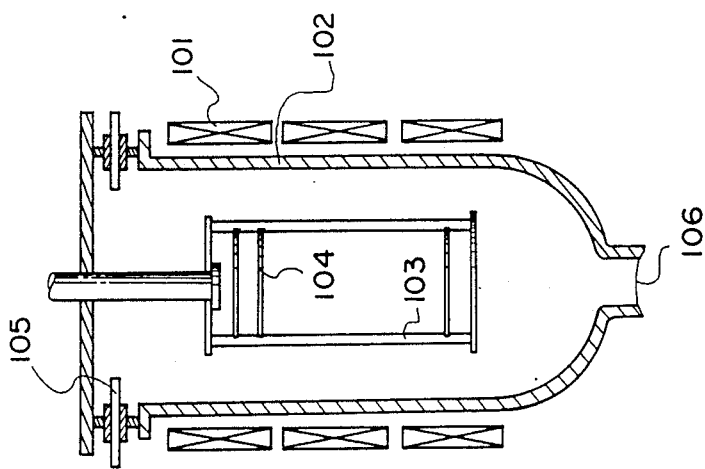
FIG. 7 is a longitudinal sectional view showing an epitaxial growth apparatus of a third prior art.

Preferred embodiments of the present invention will be described with reference to the accompanying drawings. Sizes, materials, shapes, and relative layout of the components to be described in the preferred embodiments are merely illustrations and do not limit the scope of the present invention.

FIGS. 1 to 3 show a hot wall type LPCVD apparatus according to an embodiment of first, second, and fifth aspects of the present invention.

The LPCVD apparatus comprises a base 1 having an exhaust passage 6 and adapted to support a gas conduit 4, a reactor housing, and substrate supporters 5. The reactor comprises an inner casing 2 and an outer casing 3 placed on a sealing means 7. The substrate supporters 5 are located inside the inner casing 2. Those members are made of a quartz glass material.

The base 1 offers an upper surface on which an inner casing mounting base 11 having a drum shape is placed, and through the center of which the exhaust passage 6 connected to a suction pump 12 extends at the center of the mounting base 11. The base 11 (i.e., the base 1) also supports the gas conduit 4 extending upward to the upper portion of the inner casing 2 in and along the axis of the exhaust passage 6.

The upper end portion of the gas conduit 4 is enlarged spherically, and a large number of through holes 13a are formed in the sphere to constitute radial gas outlet ports 13 so that the reaction gas distributed from the gas outlet ports 13 in a reaction chamber 1A can be radially injected to the peripheral portion within the reaction chamber 1A along the inner wall surface of the inner casing 2.

A mirror-like guide plate 9 is mounted below the gas inlet ports 13.

The guide plate 9 has a diameter equal to or slightly larger than that of the space for housing the substrate supporters 5. The peripheral portion of the guide plate 9 is arcuated downward, so that the reaction gas introduced from the gas outlet ports 13 into the reaction chamber 1A can be distributed to the peripheral portion within the reaction chamber 1A along the upper surface of the guide plate 9 and can be bent downward along the inner wall surface of the inner casing 2 around the peripheral edge of the guide plate 9.

The guide plate 9 may be made of a quartz glass plate but preferably a high-impurity, high heat-absorbency graphite (preferably coated with SiC). Heat radiation from heat sources 10 can be absorbed by the guide plate 9, thereby further enhancing uniformity of the temperature profile in the reaction chamber 1A. The guide plate 9 may be made of a heat-insulating material other than graphite if such a material does not contaminate the reaction chamber.

Fibrous Quartz 14 or any other heat-insulating material is filled inside the mounting base 11, and heat in the reaction chamber 1A is interrupted not to reach the base 1.

The outer casing 3 is a domed member made of a transparent quartz glass material having high transparency of infrared rays. Infrared lamps or other heat sources 10 are located to surround the outer surface of the outer casing 3 at predetermined intervals.

The material of the outer casing 3 is not limited to the transparent quartz glass having poor absorbency of infrared rays but may be made of an opaque quartz glass material with bubbles inside. The infrared rays transmitted through the outer casing 3 can be scattered, and therefore uniform heating performance can be improved.

The lower end of the outer casing is sealed by the pressure-tight seal means 7 mounted on the base 1.

The inner casing 2 is made of a quartz glass and has a domed shape similar to the outer casing but smaller than that. The lower end of the inner casing can communicate with a partitioned room 2A and is mounted on the mounting base 11 to a degree that dust cannot enter therebetween. However, the inner casing 2 may be hermetically sealed in the same manner as in the outer casing 3. A purging gas may be supplied to a partitioned room 2A defined by the inner and outer casings 2 and 3, and the reaction gas may be supplied to the reaction chamber 1A.

As shown in FIG. 3, each substrate supporter 5 comprises a lower plate 15, an upper plate 16, and three rod-like keel members 18. The upper and lower plates 16 and 15 horizontally are vertically aligned and are spaced apart from each other, and the keel members 18 are fixed to the corresponding circumferential portions of the upper and lower plates 16 and 15 at predetermined angular positions. A large number of support recesses 19 are grooved at the inner side of each keel member 18, so that 20 to several tens of disk-like susceptors 21 respectively supporting wafers 20 can be supported by the keel members 18 substantially perpendicular to the axis of the supporter 5.

In each supporter 5, in order to make substrate handling easy, the keel members 18 are concentrated toward the central portion of the inner casing, and the susceptors 21 for respectively supporting the wafers 20 are loaded/unloaded from the peripheral side of the inner casing 2. In addition, in order to stably support the wafers during reactions, the wafers can be supported inclined slightly downward and toward the center of the inner casing 2. When the susceptor does not rotate about its axis, the wafers are favorably inclined downward at a maximum of about 20° from the horizontal plane radially inward or outward in consideration of the overall balance of the gas flow. Therefore, the gas flow can affect the entire surface of each wafer.

Two to four supporters 5 are symmetrically placed in the peripheral portion within the reaction chamber 1A around the discharge passage 6.

The susceptor 21 for supporting the wafer 20 may be made of quartz glass, but is preferably made of heat-absorbing graphite. In this case, the susceptor absorbs heat radiated from the heat sources 10 and thereby improves uniformity of the temperature profile across the wafer 20.

The operation of the above embodiment will be described below.

The reaction chamber 1A is filled with a purging gas. $H_2$ gas is supplied from the gas conduit 4 in the reaction chamber 1A, and at the same time the reaction chamber 1A and the partitioned room 2A are evacuated to a vacuum of about 1 to 10 torr. The inner casing 2 is heated through the outer casing 3 by the heat sources 10 which surround the outer casing 3. The reaction chamber 1A is heated to a predetermined temperature (1,100° to 1,200° C.). A reaction gas prepared by mixing a source gas and a doping gas with a carrier gas ($H_2$ gas) at a predetermined mixing ratio is supplied from the gas conduit 4 in the reaction chamber 1A.

The reaction gas supplied from the gas outlet ports 13 located at the upper end of the gas conduit 4 into the upper portion of the reaction chamber 1A is distributed toward the peripheral portion in the reaction chamber 1A over and along the guide plate 9 and is directed downward around the peripheral edge of the guide plate 9. The downward gas flow then flows in the reaction region on the surface of each wafer 20 radially and inwardly through a wafer gap 22 from near the inner wall surface of the inner casing 2. Epitaxial growth is performed in a laminar flow condition keeping on the initial concentration of the source gas across the whole wafer. After the gas passes through the reaction region on the surface of each wafer 20, the gas is discharged from the exhaust passage 6 at the central portion of the reactor without affecting the reaction region of the surface of another substrate.

According to this embodiment, as the reaction gas flows in a curtain-like manner along the inner wall surface of the cylindrical inner casing 2, the fresh gas can be supplied to even the lower wafers 20. However, the reacted gas collected in the central space may partially mixed into the reaction region on the surface of lower wafer 20.

FIG. 4 shows an arrangement for eliminating the above drawback. A difference between the above embodiment and this modification (FIG. 4) will be primarily described hereafter.

A cylindrical pipe 30 is inserted as the exhaust passage at the central portion of the reaction chamber 1A and reaches the lower surface of the guide plate 9. Through holes 31 are formed in the surface of the cylindrical pipe 30 at positions corresponding to the gaps 22 of the supporters 5.

A large number of annular holes 33 are circumferentially formed at positions corresponding to the peripheral portions in the inner casing on the mounting base 11. These holes 33 communicate with an hollow ring 34 arranged in the mounting base 11, and the hollow ring 34 is coupled to a suction pump 36 through an exhaust pipe 35.

According to this modification, a suction from the exhaust passage 30 and a suction from the exhaust pipe 35 communicating with the holes 33 are properly balanced at a predetermined ratio. The reaction gas introduced from the gas outlet ports 13 to the upper portion of the reaction chamber 1A and distributed toward the peripheral portion in the reaction chamber 1A along the guide plate 9 properly flows in a more curtain-like manner along the inner wall surface of the inner casing 2 by the suction from the holes 33. The nonreacted gas can be properly conditioned to a laminar flow even for the lower gaps 22, and at the same time, the reacted gas having passed through the reaction region on the surface of each wafer 20 is properly exhausted outside the inner casing 2 through the corresponding hole 31 formed on the side surface of the cylindrical pipe 30. Therefore, the reacted gas from upward does not essentially affect the reaction region of the surface of the lower wafer 20.

In order to prevent part of the gas reacted at the reaction region on the surface of the upper wafer 20 from mixing into the reaction region on the surface of the lower wafer 20 through the gap between the susceptors, a plurality of exhaust pipes may be aligned in a bundle or concentrically arranged as a multilayer structure. An upper end exhaust hole for each pipe is faced for each of groups of adjacent wafers, and the gas may be exhausted from these upper end exhaust holes at predetermined flow rates.

FIG. 5 shows an LPCVD apparatus according to an embodiment of particularly a third aspect of the present invention. Differences between this embodiment and the previous embodiment will be described. In the embodiment of FIG. 5, the LPCVD apparatus comprises a base 40 for supporting an outer casing 3 through a seal means 7, a cylindrical pipe 42 rotatably supported on the base 40 along its axis through an annular seal 41 and having a upper end portion connected to a guide plate 9, an inner casing support base 43 fixed midway along the cylindrical pipe 42 and rotated with rotation of the cylindrical pipe 42, and supporter mounting bases 45 fixed on the inner casing mounting base 43 around the cylindrical pipe 42 by a predetermined radial distance from the chamber center line and rotatably supported on support shafts 44.

Through holes 31 are formed on the outer surface of the cylindrical pipe 42 above the inner casing support base 43, at positions corresponding to wafer gaps 22 of the supporters 5 in the same manner as in the previous embodiment.

A first gear 47 meshed with a motor gear 46 is coaxially mounted at the lower end of the cylindrical pipe 42 below the base 40. In a partitioned room defined by the base 40 and the inner casing support base 43, a second gear 49 is fixed on the base 40 so as to be coaxial with the axis of the cylindrical pipe 42 through a central hole 49a receiving the cylindrical pipe 42, and the second gear 49 is meshed with gears 48 respectively mounted at the lower ends of the support shafts 44.

A gas conduit 4 extends along the cylindrical pipe 42 and a gas outlet port 13 formed at the upper end of the conduit 4 is located above a hole 51 formed at the center of a guide plate 9. The conduit 4 is fixedly supported by a support means (not shown) at a predetermined position without rotating even if the cylindrical pipe 42 is rotated.

According to this embodiment, upon rotation of a motor 50, the inner casing support base 43 and the inner casing 2 supported thereby are rotated through the motor gear 46, the first gear 47, and the cylindrical pipe 42. The substrate supporters 5 are rotated about the axis of the inner casing 2. At the same time, the support shafts 44 are rotated about the second gear 49 mounted on the base 40 upon rotation of the supporters 5 about the axis of the inner casing 2. Therefore, the supporters 5 are rotated about their axes through the gears 48, the support shafts 44, and the mounting base 45.

Since the conduit 4 is stationary without being rotated upon rotation of the cylindrical pipe 42, the gas flow direction is relatively changed with respect to the wafers in the circumferential direction upon rotation of the inner casing 2, thereby further enhancing the above-mentioned effect.

In this embodiment, since the wafers or substrates 20 parallelly supported by the substrate supporters 5 are rotated about their axes, i.e., the support shafts 44, the substrates shall not be inclined in any direction but shall be horizontally set.

FIG. 6 shows an LPCVD apparatus according to an embodiment of particularly a fourth aspect of the present invention. Differences between this embodiment and the embodiment of the third aspect will be described. In the embodiment of FIG. 6, an inner casing support base 53 is supported on a base 40 by a support rod 56, while a cylindrical pipe 42 is aligned on the axis through annular seals 41 and 53a. A relay gear 59 is arranged in a partitioned room defined by the base 40 and the inner casing support base 53, and the relay gear 59 is meshed with gears 48 of supporter mounting bases 55.

According to this arrangement, upon rotation of the cylindrical pipe 42, the relay gear 59 is driven. Upon rotation of the relay gear 59, the gears 48 are rotated. The supporter mounting bases 55 and the substrate supporters 5 are rotated about support shafts 44, respectively, so that the substrates of each supporter 5 are rotated about the corresponding support shaft 44. In this case, since the inner casing support base 53 is fixed on the base 40 by the support rod 56, the inner casing support base 53 is not rotated about the axis of the inner casing 2. Therefore, only rotation of the substrates in the supporters 5 about the support shafts 44 is performed.

As described above, the effects of the present inventions can be smoothly achieved by all embodiments described above. These embodiments also have the following effect in addition to the above-mentioned effects.

In each embodiment described above, the reactor comprises a double structure consisting of the inner and outer casings 2 and 3 and the seal means 7 is provided to only the outer casing 3. The inner pressure of the inner casing 2 can be set substantially equal to that of the outer casing 3. Therefore, the outer casing 3 shall sufficiently be rigid and the inner casing 2 may be a thin-walled casing, further being able to have a shape different from that illustrated in each embodiment. This leads to a reduction in manufacturing cost and flexible designability of the inner casing 2. For example, the shape of the inner casing may be changed to allow an easy, uniform gas flow supplied to the surface of the wafer 20.

Since the wafers are arranged substantially along the radial direction of the inner casing 2, the uniform temperature profile of each wafer 20 can be obtained to eliminate defects such as slip lines.

Since the wafers 20 are parallel to each other and inclined upward at a several degrees along the gas flow direction, the gas can easily enter into the gaps 22 and can pass in a laminar flow condition toward the center of the reactor along the surfaces of the wafers 20.

In each embodiment described, the film formation surface of the substrate or wafer 20 faces upward. However, the film formation surface may face downward. In this case, a minimum peripheral area of the lower surface of the substrate must be supported, and a proper cover is required to prevent growth on the opposite surface. However, attachment of microparticles on the front surface of the wafer, which is caused by the reaction gas and which results in abnormally grown crystal defects frequently caused when the film formation surface faces upward, can be prevented.

What is claimed is:

1. An apparatus for forming thin films on respective surfaces of a plurality of substrates, said apparatus comprising a vertical reactor defining a reaction space and having a vertical axis, an exhausting means provided along said reactor axis, a plurality of substrate supporters arranged in a peripheral space around said exhausting means and spaced a predetermined radial distance from said exhausting means, each of said substrate supporters carrying a set of vertically stacked substrates spaced a predetermined distance from each other, and means for passing reaction gas substantially vertically along an inner wall surface of said reactor situated radially outward of said substrate supporters, so that said reaction gas passes through reaction regions on the surfaces of individual substrates and then is discharged directly out of said reactor through said exhausting means.

2. An apparatus according to claim 1, wherein substrates stacked in said substrate supporters are inclined radially along the flow direction of the reaction gas at a predetermined angle.

3. An apparatus according to claim 2, wherein said substrate supporters are fixed about the axis of the reactor.

4. An apparatus according to claim 3, wherein said substrate supporters are rotatable about the axis of the reactor.

5. An apparatus according to claim 1, wherein each of said substrate supporters is rotatable around its individual axis and also around the reactor axis.

6. An apparatus according to claim 5, wherein a gear system is provided outside said reaction space for rotating said substrate supporters around their individual axes and around the reactor axis, respectively.

7. An apparatus according to claim 1, wherein said means for passing reaction gas comprises guide plate means arranged above said substrate supporters in said reactor and extending substantially radially from said reactor axis, and reaction gas outlet means arranged above said guide plate means and near said reactor axis; whereby reaction gas introduced into said reactor from said outlet means is dispersed along the upper surface of said guide plate means to the periphery of the reactor and flows substantially vertically downward along said inner wall surface of the reactor.

8. An apparatus according to claim 7, wherein a suction means in the form of a hollow ring is formed at a lower portion of said reactor adjacent said inner wall surface so that reaction gas flowing on the peripheral side of the reactor can be sucked by the suction means.

9. An apparatus according to claim 7, wherein said reaction gas outlet means is rotatable around said reactor axis.

* * * * *